United States Patent
Sekar et al.

(10) Patent No.: US 10,224,100 B2
(45) Date of Patent: Mar. 5, 2019

(54) REDUCED CURRENT MEMORY DEVICE

(71) Applicant: RAMBUS INC., Sunnyvale, CA (US)

(72) Inventors: Deepak Chandra Sekar, San Jose, CA (US); Brent S. Haukness, Monte Sereno, CA (US); Bruce L. Bateman, Fremont, CA (US)

(73) Assignee: RAMBUS INC., Sunnyvale, CA (US)

( * ) Notice: Subject to any disclaimer, the term of this patent is extended or adjusted under 35 U.S.C. 154(b) by 0 days.

(21) Appl. No.: 15/100,167

(22) PCT Filed: Dec. 3, 2014

(86) PCT No.: PCT/US2014/068394
§ 371 (c)(1),
(2) Date: May 27, 2016

(87) PCT Pub. No.: WO2015/084971
PCT Pub. Date: Jun. 11, 2015

(65) Prior Publication Data
US 2017/0004883 A1    Jan. 5, 2017

Related U.S. Application Data

(60) Provisional application No. 61/911,393, filed on Dec. 3, 2013.

(51) Int. Cl.
*G11C 11/00* (2006.01)
*G11C 13/00* (2006.01)
(Continued)

(52) U.S. Cl.
CPC ...... *G11C 13/0069* (2013.01); *G11C 11/1659* (2013.01); *G11C 11/1675* (2013.01);
(Continued)

(58) Field of Classification Search
None
See application file for complete search history.

(56) References Cited

U.S. PATENT DOCUMENTS 4,922,455 A * 5/1990 Chin ................ G11C 11/4113
365/154
2003/0039166 A1 * 2/2003 Shau ..................... G11C 7/02
365/230.03

(Continued)

OTHER PUBLICATIONS

International Search Report and Written Opinion, PCT Application No. PCT/US2014/068394, dated Apr. 14, 2015.
(Continued)

*Primary Examiner* — Uyen B Tran
(74) *Attorney, Agent, or Firm* — Womble Bond Dickinson (US) LLP; Daniel E. Ovanezian

(57) ABSTRACT

A memory device includes a local bit line coupled to a plurality of memory cells and a global bit line through first and second selectable parallel paths having first and second impedances, respectively. The first path is active in at least one of a set operation or a forming operation and the second path is active in a reset operation. A select device to select a memory element includes a drain having a first doping level and a source having a second doping level lower than the first doping level, wherein the device is configured to provide a first on impedance or a second on impedance to the resistive memory element in response to a control signal.

19 Claims, 11 Drawing Sheets

(51) Int. Cl.
   *G11C 11/16* (2006.01)
   *H01L 45/00* (2006.01)
   *H01L 27/24* (2006.01)

(52) U.S. Cl.
   CPC ........ *G11C 13/003* (2013.01); *G11C 13/0097* (2013.01); *H01L 27/2409* (2013.01); *H01L 27/249* (2013.01); *H01L 27/2436* (2013.01); *H01L 45/04* (2013.01); *H01L 45/06* (2013.01); *H01L 45/085* (2013.01); *H01L 45/1226* (2013.01); *H01L 45/144* (2013.01); *H01L 45/146* (2013.01)

(56) References Cited

U.S. PATENT DOCUMENTS

| | | | |
|---|---|---|---|
| 2006/0071275 A1* | 4/2006 | Brask | H01L 21/845 257/350 |
| 2012/0257437 A1* | 10/2012 | Seko | G11C 11/5678 365/148 |
| 2013/0043455 A1* | 2/2013 | Bateman | H01L 27/2454 257/5 |
| 2013/0069030 A1* | 3/2013 | Wells | H01L 45/085 257/4 |
| 2013/0070506 A1 | 3/2013 | Kajigaya | |
| 2013/0170283 A1* | 7/2013 | Lan | G11C 13/0007 365/148 |
| 2013/0208528 A1 | 8/2013 | Kwak et al. | |
| 2013/0208530 A1* | 8/2013 | Oh | G11C 13/0002 365/148 |
| 2013/0221314 A1 | 8/2013 | Pramanik et al. | |
| 2014/0056055 A1* | 2/2014 | Ikeda | G11C 13/00 365/148 |
| 2014/0098594 A1* | 4/2014 | Azuma | H01L 27/2418 365/148 |
| 2014/0268991 A1* | 9/2014 | Hu | G11C 13/0002 365/148 |

OTHER PUBLICATIONS

Notification Concerning Transmittal of International Preliminary Report on Patentability dated Jun. 16, 2016 re: Int'l Appln. No. PCT/US14/068394. 20 Pages.

PCT International Search Report and Written Opinion dated Apr. 14, 2015 re Int'l. Appln. No. PCT/US14/68394. 11 pages.

\* cited by examiner

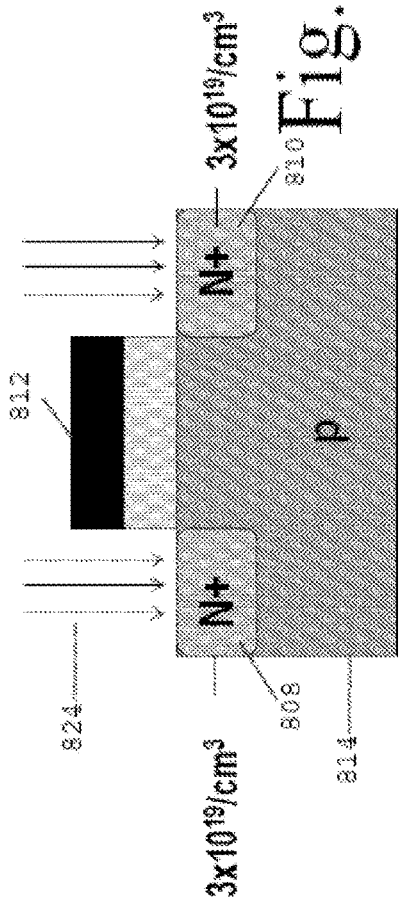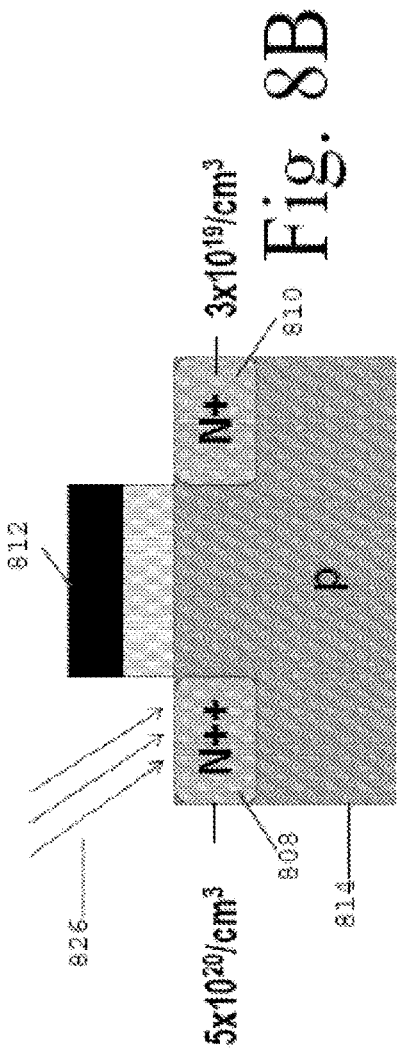

REDUCED CURRENT MEMORY DEVICE

CROSS REFERENCE

This application is the US National Phase of International Application Number PCT/US2014/068394, filed 3 Dec. 2014 and titled REDUCED CURRENT MEMORY DEVICE, which claims the benefit of and priority to U.S. Provisional Application No. 61/911,393, filed 3 Dec. 2013.

TECHNICAL FIELD

We disclose a reduced current memory device.

BACKGROUND

Non-volatile memory devices that retain stored data in the absence of power are pervasively used in many electronic products. Unfortunately, many non-volatile memory devices have limitations that make them unsuitable for use as primary storage for these products including higher cost and lower performance when compared to volatile memory devices such as dynamic random access memory (DRAM). Examples of non-volatile memory devices include read-only memory (ROM), flash memory, ferroelectric random access memory (FRAM), resistive random access memory (RRAM), phase change memory, and the like.

RRAM, and filamentary RRAM in particular, have recently gained development momentum. A challenge to RRAM device commercialization is high write current requirements resulting from long bit lines having high capacitance. When the RRAM cell switches, capacitive surge currents from long bit lines discharge through the cell making the filament wider. Relatively high write currents are needed to break the wider filament. For example, if the capacitance of a bit line is 0.1 pF and the RRAM switches in 1 ns at 2V, the surge current is given by:

$$I = C \times dv/dt = 0.1 \times 2V/1 \text{ ns} = 200 \text{ uA}$$

This 200 uA current during a SET operation often requires a similar 200 uA current during a RESET operation, which, in turn, results in a power hungry RRAM device that reduces battery life. Many electronic products, however, require extended battery life. A need exists, therefore, for an improved reduced current memory device.

BRIEF DRAWINGS DESCRIPTION

FIGS. 8A and 8B are diagrams of an embodiment of a method of achieving asymmetric source/drains according to the present disclosure.

DETAILED DESCRIPTION

Figure 1:
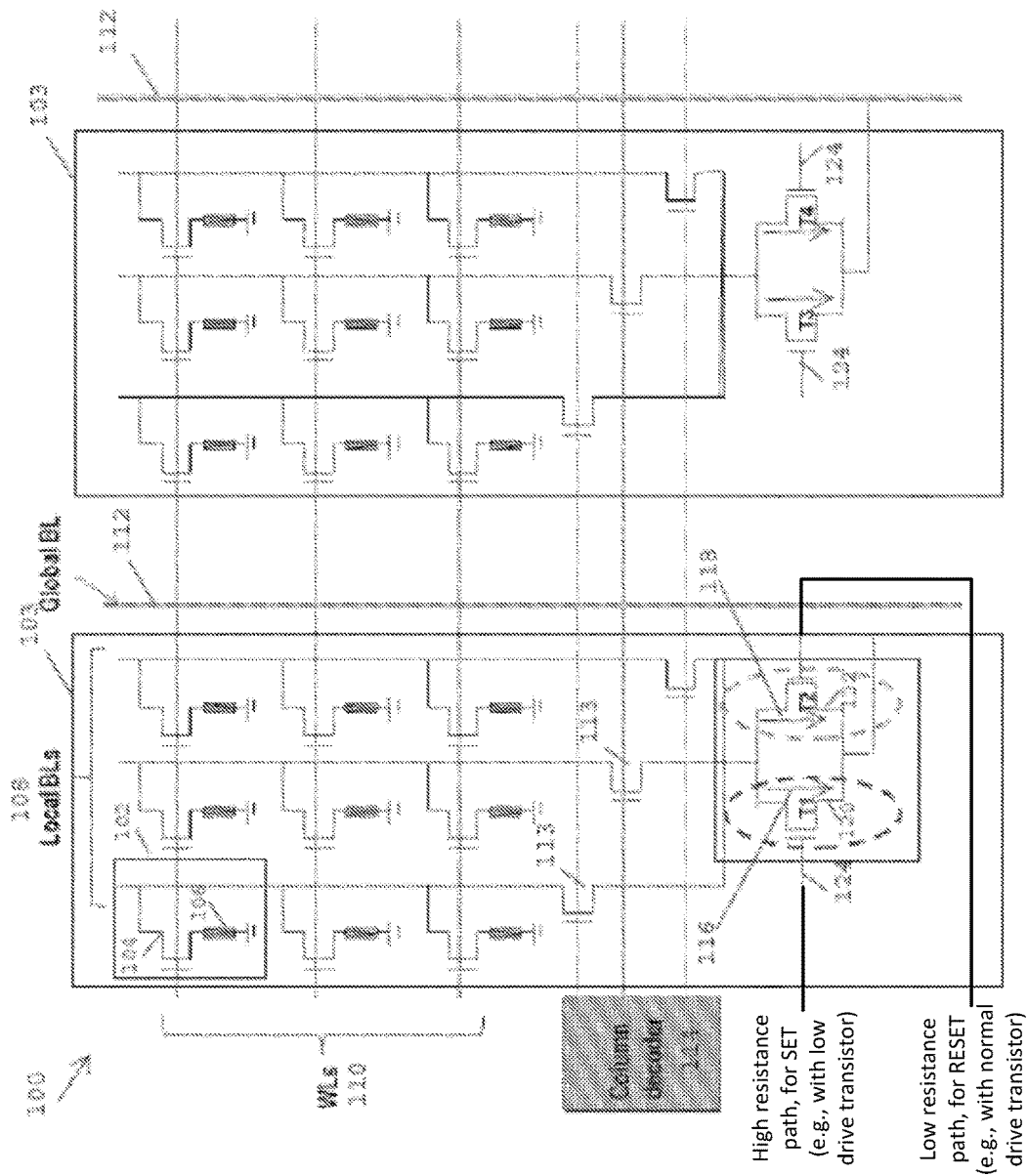
FIG. 1 is a diagram of an embodiment of a memory device according to the present disclosure.

FIG. 1 is a diagram of an embodiment of a memory device 100 according to the present disclosure. Referring to FIG. 1, memory device 100 comprises an array of memory elements 102 (only some of which are labeled) arranged in vertical columns and horizontal rows in portions 103. Each memory element 102 comprises one transistor (1T) 104 and one resistive memory element (1R) 106, hence the 1T-1R moniker. A person of ordinary skill in the art will recognize that memory element 102 may comprise any type of two-terminal rewritable memory element capable of programming to a selective one of two or more memory states. In one embodiment, a memory element 102 comprises a discrete, non-volatile, re-writable resistive memory cell made from any number of materials (e.g., CMO) known to a person of ordinary skill in the art. In other embodiments, memory element 102 may comprise a filamentary resistive random access memory (RRAM) cell, an interfacial RRAM cell, a magnetoresistive RAM (MRAM) cell, a phase change element (e.g., chalcogenides including alloys of germanium, antimony, and tellurium), a memristor memory element, and a programmable metallization cell (e.g., conductive bridging RAM (CBRAM) cell). A person of ordinary skill in the art will recognize that other types of memory elements can be used, whether based on resistive states or on some other memory storing mechanism, whether re-writable or not, or whether volatile or not.

Each portion 103 is associated with one of (L+1) groups of word lines (WL) 110 and one of (M+1) global bit lines (GBLs) 112, where L and M are integers greater than or equal to zero. Each portion 103 is also associated with one of (N+1) groups of local bit lines (LBL) 108 electrically coupled to a number of memory elements 102, where N is an integer greater than or equal to zero. Each memory element 102 is electrically coupled to both an LBL 108 and a WL 110. Each LBL 108 is electrically coupled to a pass gate transistor 113 having a gate controlled by column decoder 114, which is well-known to a person of ordinary skill in the art and not discussed in any further detail herein. LBLs 108, WLs 110, and GBLs 112 may comprise conductive material, e.g., metal, metal containing compositions, conductively-doped semiconductor materials, and the like.

The number of memory elements 102 per LBL 108 is set during design and determined by a number of factors, including but not limited to overall memory size, operating parameters, program or erase operation parameters, type of memory element 102, parasitic capacitance in both the memory element 102 and the LBL 108, resistance and capacitance of the LBL 108 associated with the GBL 112, and the like. Examples of operating parameters include but are not limited to read current, write current, program current, erase current, read speed, write speed, read disturb, write disturb, and the like.

GBL 112 is associated with one of the portions 103 and is electrically coupled to the LBLs of that portion through a first selectable parallel path 116 and a second selectable parallel path 118. First and second selectable parallel paths 116 and 118 may have first and second impedances, respectively, which may be selected using control signals 124A and 124B based on the specific operation type to be performed on memory element 102, e.g., SET, RESET, or FORM. Control signals 124A and 124B may be distinct or indistinct from one another and may be generated by a controller (not shown), design of which is well known to a person of ordinary skill in the art.

In an embodiment, first selectable parallel path 116 is selected or turned on to present a first impedance between GBL 112 and LBLs 108 during a first predetermined operation type to a given portion 103, e.g., SET or FORM, which results in dampening capacitive surge currents from capacitance associated with the GBL 112. A length of the LBLs 108 is kept relatively short to avoid transients from the capacitance associated with the LBLs 108. Conversely, second selectable parallel path 118 is selected or turned on to present a second impedance, which is lower relative to the first impedance of path 116, to drive large currents through memory elements 102 during a second predetermined operation type, e.g., RESET. By providing parallel selectable paths 116 and 118, memory device 100 may present different impedances between the GBL 112 and corresponding LBLs 108 that advantageously conserve power by reducing the current needed in a predetermined operation type, e.g., SET.

In an embodiment, first selectable parallel path 116 comprises a first switching element 120, e.g., transistor T1, having a first impedance when selected in response to the first operation type, e.g., SET or FORM, to be performed on a memory element 102. Likewise, second selectable parallel path 118 comprises a second switching element 122, e.g., transistor T2, having a second impedance when selected in response to the second operation type, e.g., RESET, to be performed on a memory element 102. The first and second operations may be different from one another. First and second switching elements 120 and 122 may both be turned on during certain predetermined operation types, e.g., SET, RESET, or FORM.

In an embodiment, the first and second switching elements 120 and 122 are active or turned on in response to control signals 124A and 124B, which may be distinct or indistinct from one another and may be generated by a controller or other device (not shown) well known to a person of ordinary skill in the art.

In an embodiment, first and second switching elements 120 and 122 are of different types, e.g., second switching element 122 may be a low drive current transistor, which may be provided by, e.g., adjusting or tuning the source or drain during manufacture. Put differently, in such an embodiment, the first and second impedances are made to vary by changing the source or drain doping of each of the first and second switching elements 120 and 122, respectively, during their manufacture. The impedance presented by each of first and second switching elements 120 and 122 may change by orders of magnitude depending on the magnitude of the source and drain implant dose made to each of first and second switching elements 120 and 122. In an embodiment, first switching element 120 comprises a first source and drain doping level and second switching element 122 comprises a second source and drain doping level different or asymmetric from the first source and drain doping level. The first source and drain doping level may be lower than the second source and drain doping level by at least a factor of ten, e.g., $1E19/cm^3$ and $5E20/cm^3$.

In other embodiments, first and second switching elements 120 and 122 may present first and second impedances, respectively, e.g., by manufacturing first and second switching elements 120 and 122 to have different threshold voltages, different oxide thickness, and the like.

Figure 2:
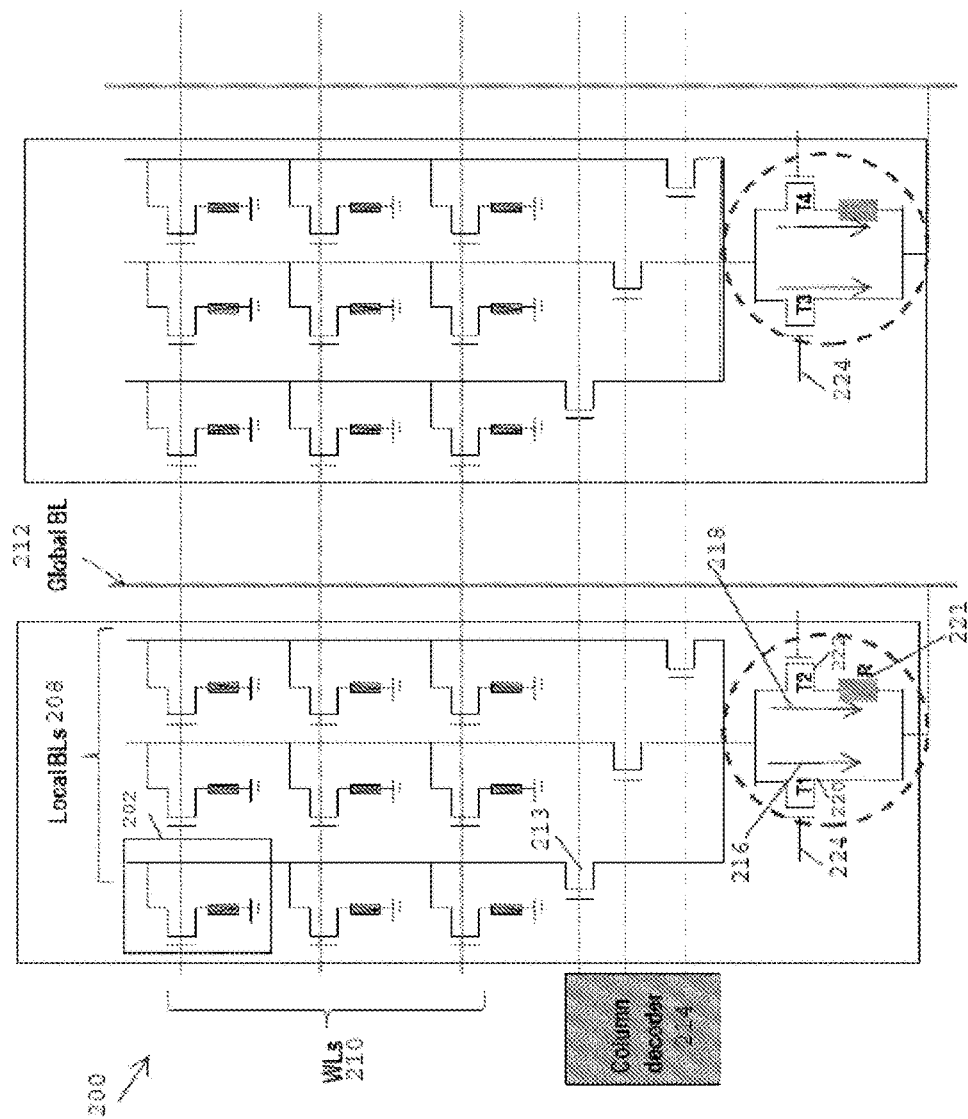
FIG. 2 is a diagram of another embodiment of a memory device according to the present disclosure.

In an embodiment shown in FIG. 2, memory device 200 comprises first selectable parallel path 216 and second selectable parallel path 218 having first and second impedances, respectively, and being controllable by control signals 224A and 224B. Control signals 224A and 224B may be distinct or indistinct from one another and may be generated by a controller or other device (not shown) well known to a person of ordinary skill in the art. GBL 212 may be associated with one of the portions 203 and may be electrically coupled to a corresponding group of LBLs of that portion through first selectable parallel path 216 and second selectable parallel path 218. Each memory element 202 is electrically coupled to both an LBL 208 and a WL 210. Each LBL 208 is electrically coupled to selectable paths 216 and 218 through a pass gate transistor 213 having a gate controlled by column decoder 214, which is well-known to a person of ordinary skill in the art and not discussed in any further detail herein.

First selectable parallel path 216 comprises a first switching element 220, e.g., transistor T1, having the first impedance when selected or turned on in response to a first predetermined operation type, e.g., RESET, to be performed on a memory element 202. Second switching element 222, e.g., transistor T2, is serially coupled to a resistor 221, the combination having the second impedance when selected or turned on in response to a second predetermined operation type, e.g., SET or FORM, to be performed on a memory element 202. The first and second operations may be different from one another. First and second switching elements 220 and 222 may both be turned on in an operation type, e.g., SET, RESET, or FORM, to be performed on memory element 202. Resistor 221 may comprise a dielectric resistor, metal-polysilicon-metal resistor, or any other resistor type appropriate for the task that is known to a person or ordinary skill in the art.

In an embodiment, transistors T1 and T2 are of a similar type, but since transistor T2 is serially coupled to resistor 221, second selectable parallel path 218 has a higher impedance than first selectable parallel path 216 comprising T1 only. The higher impedance second selectable parallel path 218 may be selected or turned on to allow for a low drive current during SET or FORM operations while the lower impedance first selectable parallel path 216 may be turned on or selected when higher currents are needed.

In an embodiment, first selectable parallel path 216 and second selectable parallel path 218 may comprise a multiple gate device (not shown) with independently-controllable gates, e.g., a FinFET, in which one gate is turned on to allow for a low drive current during SET or FORM operations or in which more than one gate or a different gate is turned on to drive high current through the memory cells 202 during a RESET operation.

Figure 3A:
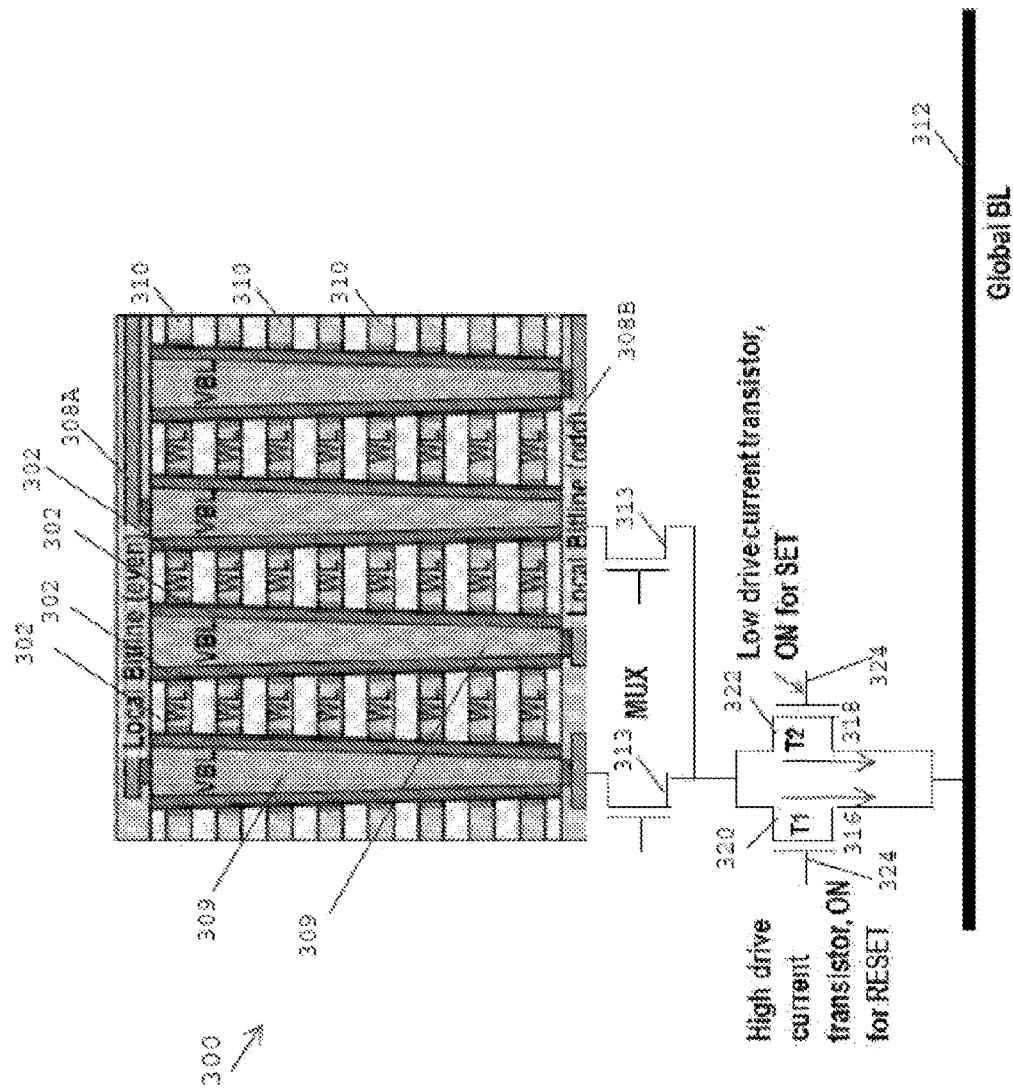
FIGS. 3A and 3B are diagrams of yet another embodiment of a memory device according to the present disclosure.
Figure 3B:
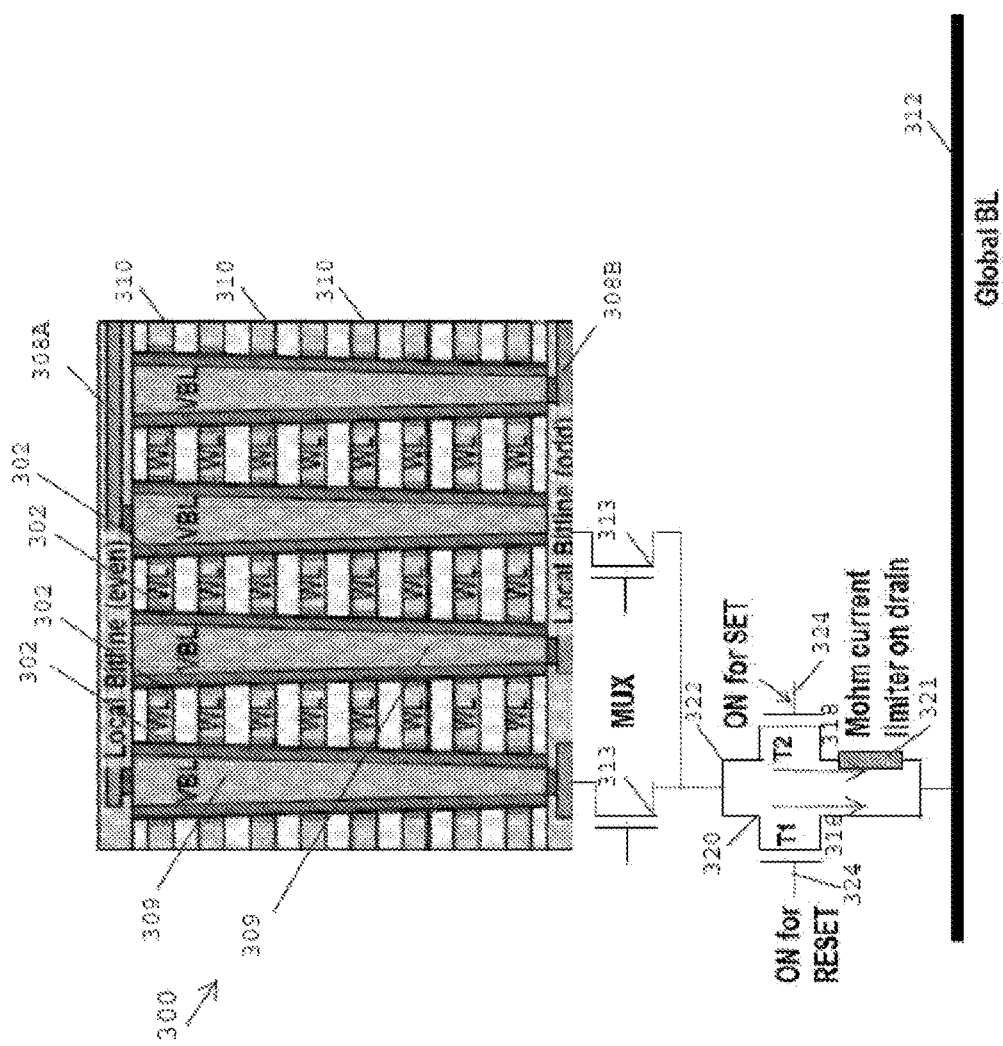

Referring to FIGS. 3A and 3B, memory device 300 comprises an array of memory elements 302 (only some of which are labeled). In an embodiment, memory device 300 may comprise a plurality of global bit lines (GBLs) 312 that extend along a horizontal direction and a plurality of word lines (WLs) 310 that extend in a horizontal direction but orthogonally to the GBLs 312. A plurality of even local bit lines (LBLs) 308A and a plurality of odd LBLs 308B extend in the horizontal direction at ends of a plurality of vertical bit lines (VBLs) 309. VBLs 309 extend vertically or upwardly from GBLs 312 through layers of WLs 310 and between adjacent columns of WLs 310. Even LBLs 308A, odd LBLs 308B, WLs 310, and VBLs 309 may comprise conductive material, e.g., at least one metal, metal containing composition, or conductively-doped semiconductor material.

Like memory elements 102 and 202, memory elements 302 may comprise two-terminal memory elements made from a material capable of being programmed to a selective one of two or more memory states. Memory elements 302 may be formed as memory "plugs" in a memory layer disposed between WLs 310 and VBLs 309 such that a memory element 302 is positioned at and between each intersection (e.g., a crosspoint) of a WL 310 with its associated VBL 309 on each layer of memory device 300. Memory elements 302 may be in any of a variety of configurations including the vertical crosspoint RRAM shown in FIGS. 3A and 3B and the like. Memory elements 302 may comprise a single homogenous composition, multiple discrete compositions, and the like.

Arranging memory device 300 in the crosspoint configuration shown in FIGS. 3A and 3B maximizes memory density and affords the ability to read data from or write data to memory elements 302 on a single bit basis, or simultaneously on a nibble, byte, word, page block, or other higher-bit basis.

GBLs 312 are coupled to LBLs 308A and 308B by pass gate transistors 313 through first selectable parallel path 316 or second selectable parallel path 318, which as their name implies, are each independently selectable through control signals 324A and 324B. Control signals 324A and 324B may be distinct or indistinct from one another. Pass gate transistors 313 may be controlled also by a controller or other device (not shown), which is well-known to a person of ordinary skill in the art and will not be discussed any further herein.

First and second selectable parallel paths 316 and 318 may comprise first and second impedances, respectively, which may be selected by control signals 324A or 324B based on the operation to be performed on memory elements 302, e.g., SET, RESET, or FORM. In an embodiment, control signals 324A and 324B may be generated by a controller or other device (not shown) well-known to a person of ordinary skill in the art.

In an embodiment, first selectable parallel path 316 is selected or turned on to present a first impedance between GBL 312 and LBLs 308A or 308B during, e.g., SET or FORM operations, which results in dampening capacitive surge currents from capacitance associated with the GBL 312. A length of the LBLs 308A and 308B and VBLs 309 is kept relatively short to avoid transients from the capacitance associated with the LBLs 308A and 308B. Conversely, second selectable parallel path 318 is selected or turned on to present a second impedance, which is lower relative to the first impedance of path 316, to drive large currents through memory elements 302 during e.g., a RESET operation. By providing parallel selectable paths 316 and 318, memory device 300 may present different impedances between the GBL 312 and corresponding LBLs 308A and 308B and VBLs 309 that advantageously conserve power by reducing the current needed in predetermined operation types, e.g., SET.

In an embodiment shown in FIG. 3A, first selectable parallel path 316 comprises a first switching element 320, e.g., transistor T1, having a first impedance when selected in response to a first operation, e.g., SET or FORM, to be performed on memory element 302. Likewise, second selectable parallel path 318 comprises a second switching element 322, e.g., transistor T2, having a second impedance when selected in response to a second operation type, e.g., RESET, to be performed on the memory element 302. The first and second operation types may be different from one another.

First and second switching elements 320 and 322 may be of different types, e.g., second switching element 322 may a low drive current transistor, which may be provided by adjusting or tuning the source drain doping. Put differently, the first and second impedances are made to vary by changing the doping of each of the first and second switching elements 320 and 322, respectively, during their manufacture. The impedance presented by each of first and second switching elements 320 and 322 may change by orders of magnitude depending on the magnitude of the source and drain implant dose made to each of first and second switching elements 320 and 322. In an embodiment, first switching element 320 comprises first source and drain doping level and second switching element 322 comprises second source and drain doping level different or asymmetric from the first source and drain doping level. The first source and drain doping level may be lower than the second source and drain doping level by at least a factor of ten, e.g., $1E19/cm^3$ and $5E20/cm^3$.

In an embodiment shown in FIG. 3B, first selectable parallel path 316 comprises a first switching element 320, e.g., transistor T1, having the first impedance when selected or turned on in response to a first operation, e.g., RESET, to be performed on memory element 302. Second switching element 322, e.g., transistor T2, is serially coupled to a resistor 321, the combination having the second impedance when selected or turned on in response to a second operation, e.g., SET or FORM, to be performed on memory element 302. The first and second operations may be different from one another. Resistor 321 may comprises a dielectric resistor, metal-polysilicon-metal resistor, or any other resistor type appropriate for the task that is known to a person or ordinary skill in the art.

In an embodiment, transistors T1 and T2 are of a similar type, but since transistor T2 is serially coupled to resistor 321, second selectable parallel path 318 has a higher impedance than first selectable parallel path 316 comprising T1 only. The higher impedance second selectable parallel path 318 may be selected or turned on to allow for a low drive current during SET or FORM operations while the lower impedance first selectable parallel path 316 may be turned on or selected when higher currents are needed.

In an embodiment, first selectable parallel path 316 and second selectable parallel path 318 may comprise a multi-gated device (not shown) with independently-controllable gates, e.g., a FinFET, in which one gate is turned on to allow for a low drive current during SET or FORM operations or in which one or more gates are turned on to drive high current through the memory elements 302 during a RESET operation.

In a similar manner that it is beneficial to couple GBLs to LBLs using selectable first and second parallel impedance paths in memory devices 100, 200, and 300 to control surge currents during predetermined operation types, it is beneficial to have a selecting element configured to select a memory element using selectable first and second parallel impedance paths.

Figure 4A:
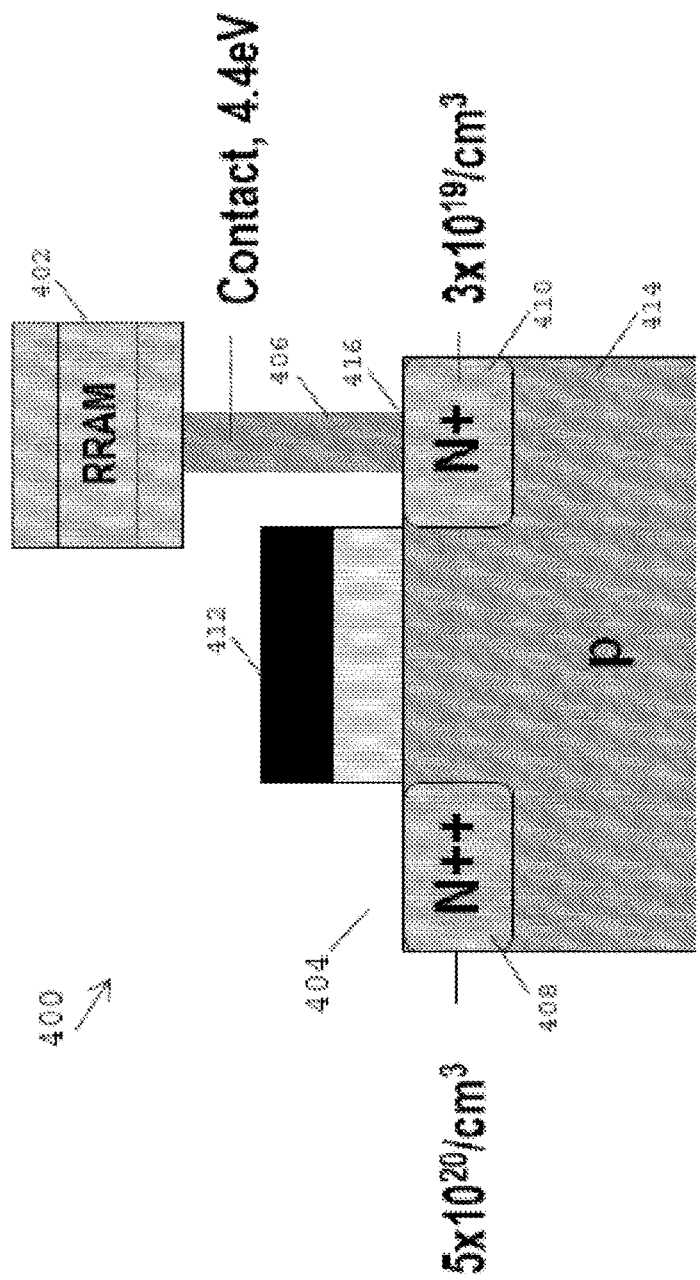
FIG. 4A is a diagram of an embodiment of a select device according to the present disclosure.

Referring to FIG. 4A, a memory device 400 comprises a memory element 402 coupled to a selecting or access element 404 through a contact 406. Selecting element 404 may limit current to the memory element 402 until a voltage differential across the memory element 402 and the selecting element 404 reaches a predetermined threshold. Selecting element 404 may be non-linear. More specifically, selecting element 404 may be highly resistive until a voltage differential reaches a predetermined value, whereupon the electronic devices transform to a conducting state. Selecting element 404 is shown as an NMOS transistor in FIG. 4A but may also be any kind of switching element, e.g., a PMOS transistor, a diode, switch, or the like, which is not shown.

A person of ordinary skill in the art will recognize that memory element 402 may comprise any type of two-terminal memory element known to a person of ordinary skill in the art. An array of memory elements 402 may form a crosspoint array as is known to a person of ordinary skill in the art. Further, although only a single access device is shown in each memory device 400, there can be multiple selecting devices 404.

Selecting element 404 may comprise drain 408, source 410, gate 412, and body or substrate 414. Drain 408 may have a different higher (or asymmetric) doping level than source 410 such that selecting element 404 is capable of providing a low impedance path for a first operation, e.g., RESET, and high impedance for a second operation type, e.g., SET or FORM. For example, drain 408 may have a higher doping level of 5E20/cm$^3$ while source 410 may have a doping level of 3E19/cm$^3$. A control signal applied to gate 412 may determine the operation that is applied to memory element 402, e.g., RESET, SET, or FORM. The control signal 412 may be generated by a controller that is known to a person of ordinary skill in the art and not described herein in any further detail.

Source 410 may be a doped semiconductor material, e.g., an N-type semiconductor material. Contact 406 may be a metal or a composite material including a metal. A junction between source 410 and contact 406 may therefore form a diode 416, which provides impedance that changes depending on the voltage applied across it. In an embodiment, diode 416 is a Schottky-type diode that will allow high currents with a low turn on voltage for positive polarity voltages and low currents with high impedance for negative polarity voltages.

Figure 5:
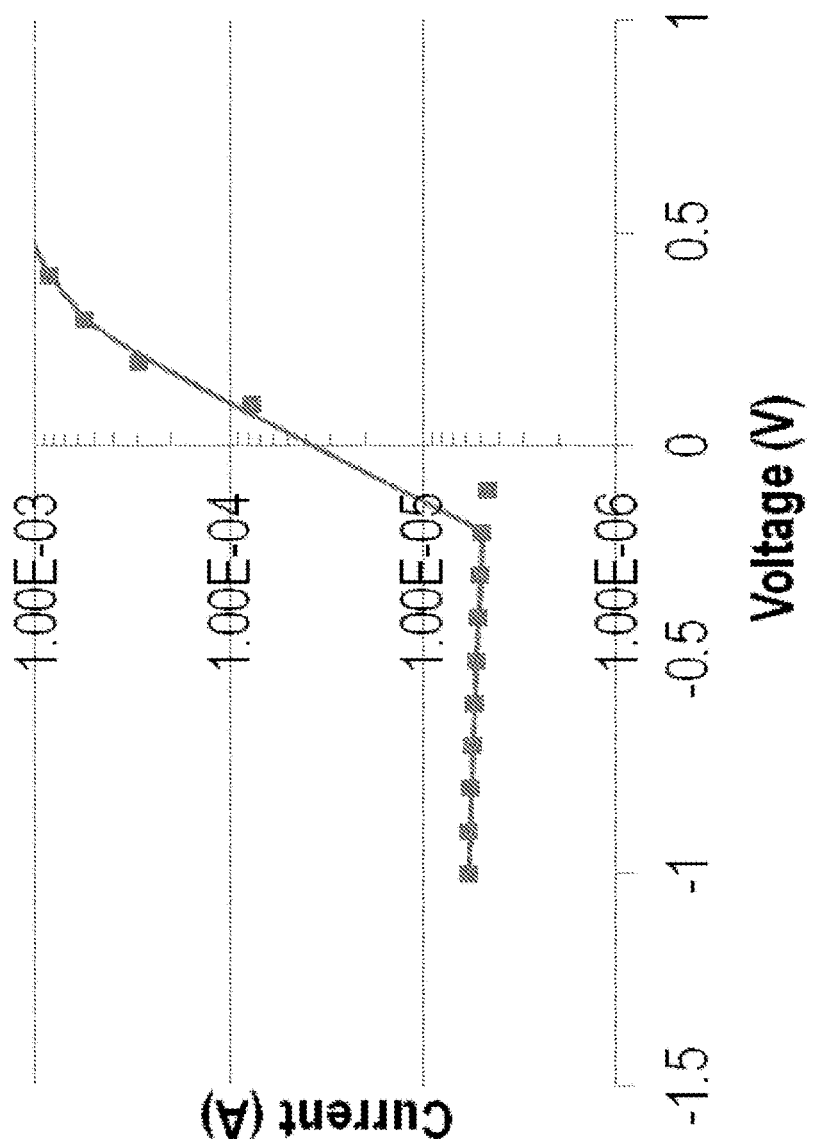
FIG. 5 is a graph of a simulation of an embodiment of a select device according to the present disclosure.

In an embodiment in which diode 416 is 100 nm×100 nm, drain 408 may have a doping level of 5E20/cm$^3$ while source 410 may have a doping level of 3E19/cm$^3$, the simulated current/voltage graph is shown in FIG. 5. Diode 416 has a high OFF impedance, e.g., in the hundred kilo ohms and a low ON impedance, e.g., in the hundred ohms.

Diode 416 may be a single crystal silicon, polysilicon, or amorphous silicon Schottky diode in series with memory element 402. At least some embodiments of diode 416 may require additional layers not shown in the figures but well-known to a person of ordinary skill in the art.

Figure 4B:
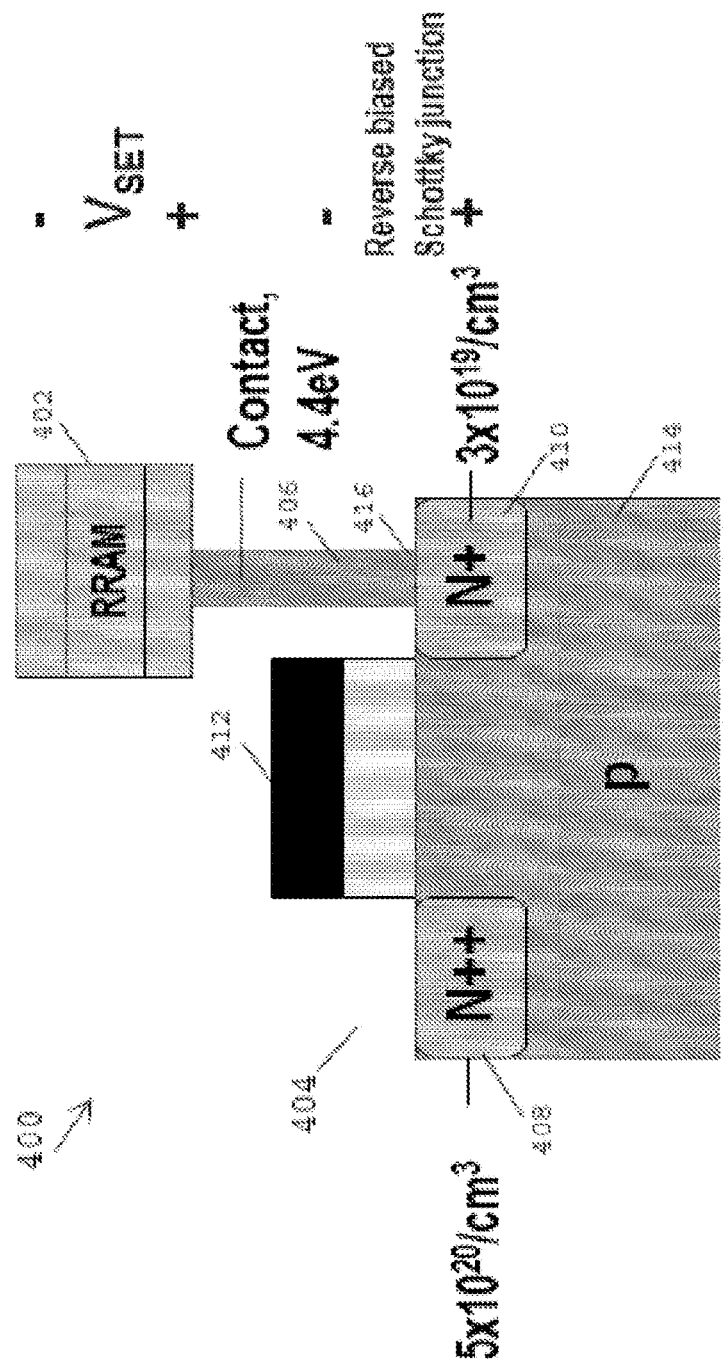
FIGS. 4B and 4C are diagrams of an embodiment of a select device with a reversed and forward biased junction, respectively.

In an embodiment shown in FIG. 4B, SET voltages $V_{set}$ are applied to the memory array that includes memory element 402. Diode 416 is reverse biased with the application of (negative polarity) SET voltage $V_{set}$ across the memory element 402, which provides a high impedance in the OFF state that may act as a current limiter to dampen capacitive surge currents from wires and junctions during a first operation type, e.g., SET or FORM.

Figure 4C:
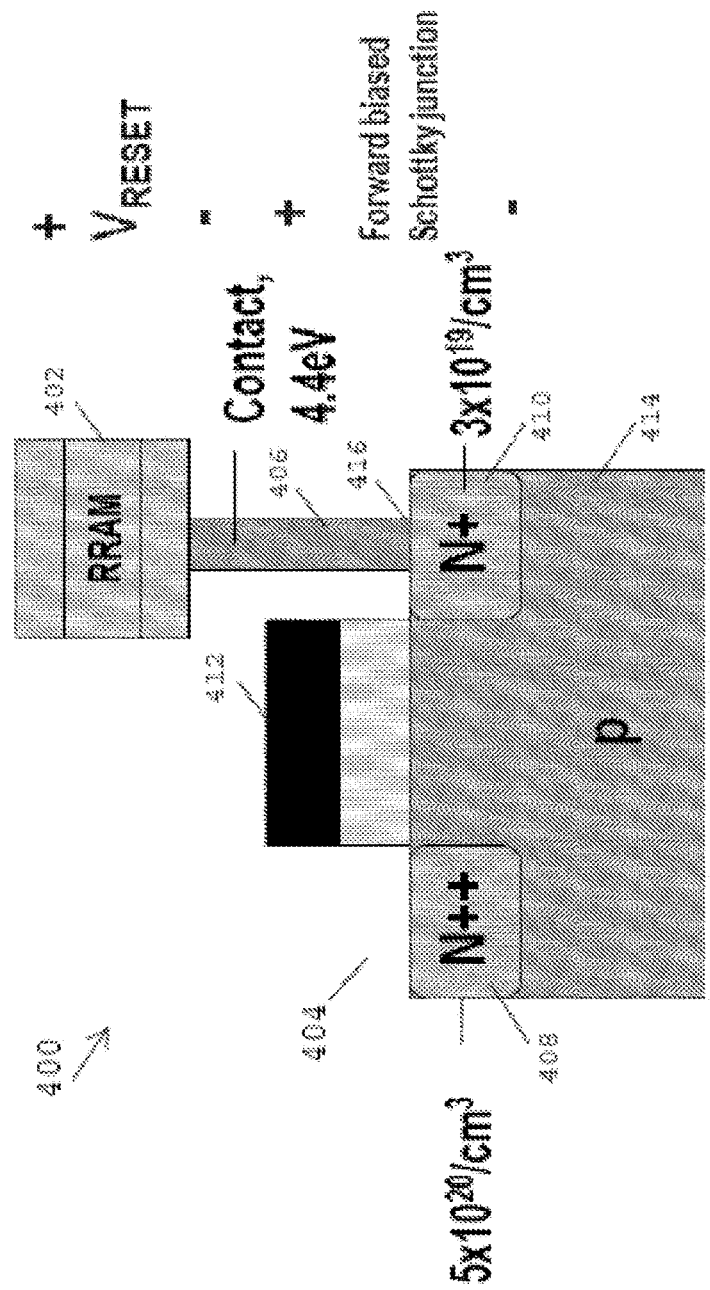

In an embodiment shown in FIG. 4C, RESET voltage $V_{reset}$ is applied to the memory array that includes memory element 402. Diode 416 is forward biased with the application of (positive polarity) RESET voltage $V_{reset}$ across memory element 402, which provides a low impedance in the ON state that may allow a low drive current during a second operation type, e.g., RESET.

Figure 6:
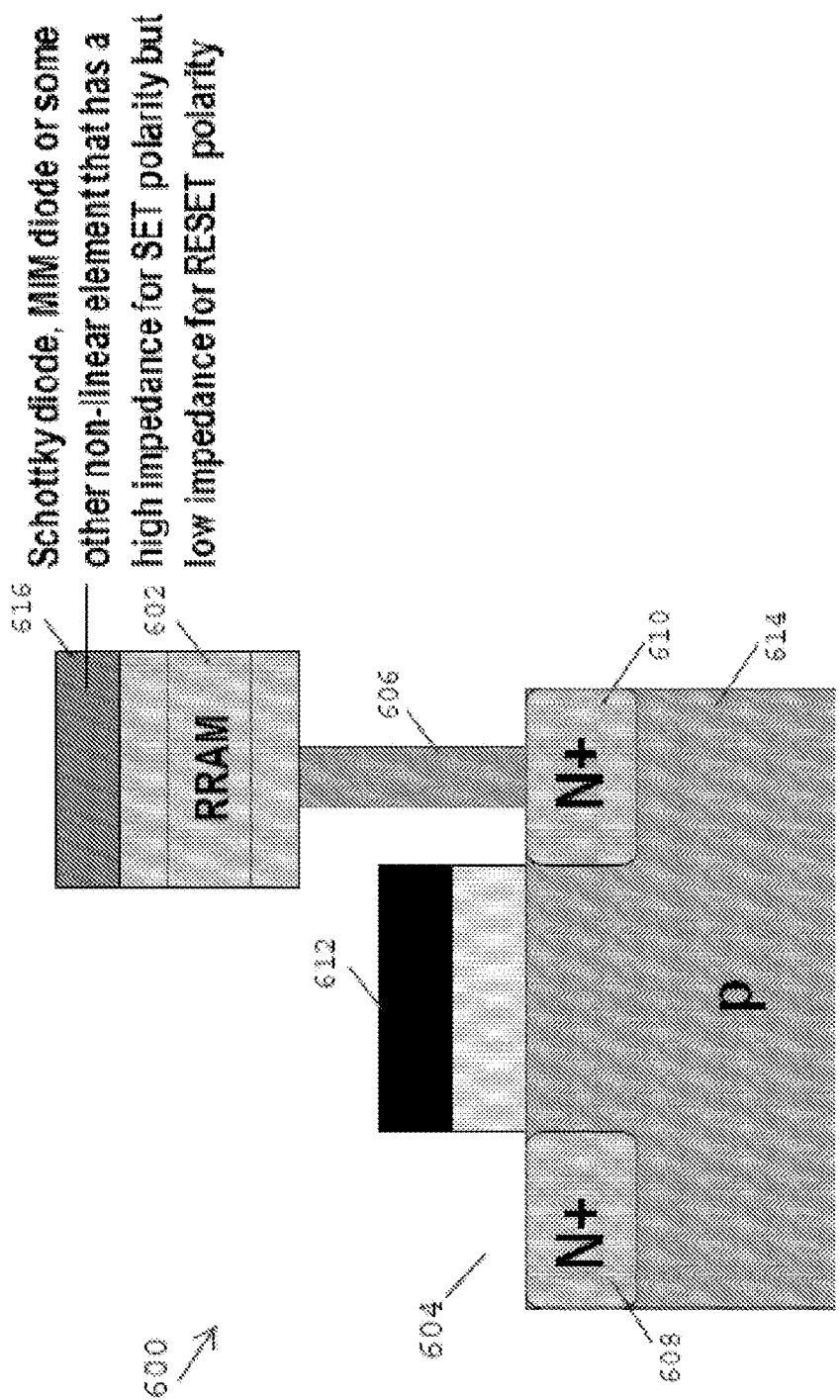
FIG. 6 is a diagram of an embodiment of a select device according to the present disclosure.

Referring to FIG. 6, memory device 600 comprises a diode 616 in series with a memory element 602, which in turn is coupled to a selecting element 604 through a contact 606. Selecting element 604 may limit current to the memory element 602 until a voltage differential across the memory element 602 and the selecting element 604 reaches a predetermined threshold. Selecting element 604 may be non-linear. More specifically, selecting element 604 may be highly resistive until a voltage differential reaches a predetermined value, whereupon the electronic devices transform to a conducting state. Selecting element 604 may be a diode, transistor, switch, or the like. A person of ordinary skill in the art will recognize that memory element 602 may comprise any type of two-terminal memory element known to a person of ordinary skill in the art. An array of memory elements 602 may form a crosspoint array as is known to a person of ordinary skill in the art. Further, although only a single access device is shown in each memory device 600, there can be multiple selecting devices 604.

Selecting element 604 comprises drain 608, source 610, gate 612, and body or substrate 614. A control signal applied to gate 612 may be generated by a controller that is known to a person of ordinary skill in the art and not described herein in any further detail. Source 610 and drain 608 may be a doped semiconductor material, e.g., an N-type semiconductor material.

Diode 616 may be a Metal-Insulator-Metal (MIM) diode or other non-linear element that exhibits high impedance for SET and low impedance for RESET operations.

Figure 7:
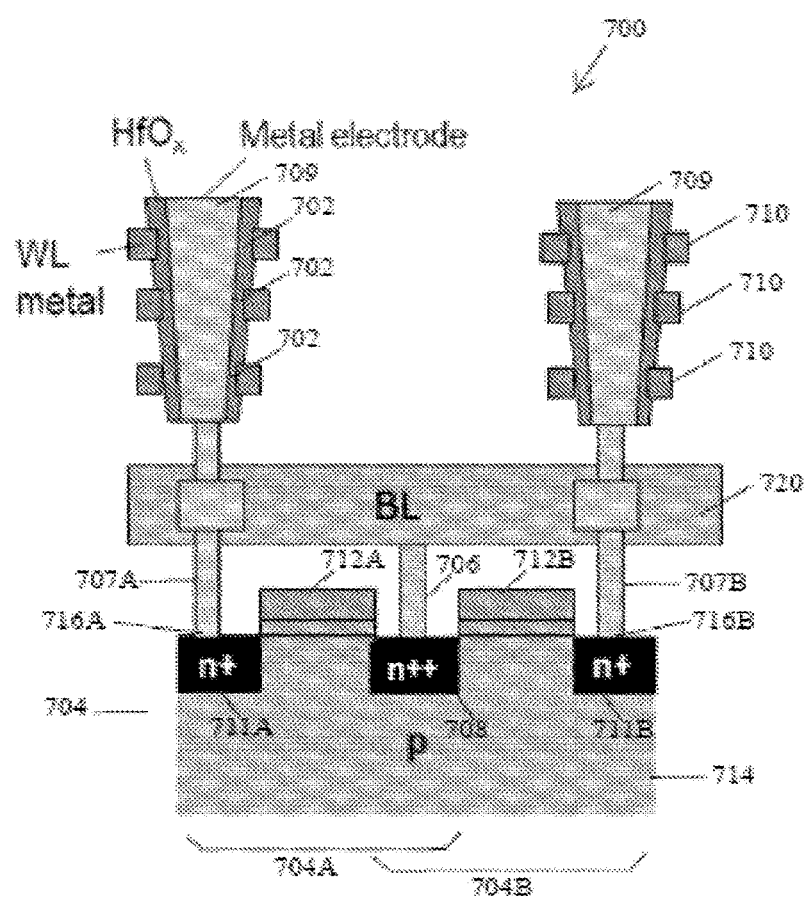
FIG. 7 is a diagram of an embodiment of a memory device according to the present disclosure.

FIG. 7 is a diagram of an embodiment of a memory device 700 according to the present disclosure. Referring to FIG. 7, a memory device 700 comprises a 1T-many R architecture implementing the asymmetric source drain concept disclosed with reference to FIG. 4A. Memory device 700 comprises an array of memory elements 702 formed between WLs 710 and VBLs 709. Like memory elements 102, 202, 302, and 402, memory elements 702 may comprise any type of two-terminal memory element known to a person of ordinary skill in the art including resistive memory and the like. An array of memory elements 702 may form a crosspoint array in any of a variety of configurations including the vertical RRAM shown in FIG. 7. A person of ordinary skill in the art will recognize that other configurations of memory elements 702 are possible.

In an embodiment, memory elements 702 may comprise WLs 710 that extend orthogonally to the BLs 720. VBLs 709 extend vertically or upwardly from selecting element 704 through layers of WLs 710 and between adjacent columns of WLs 710. BLs 720, WLs 710, and VBLs 709 may comprise conductive material, e.g., at least one metal, metal containing composition, or conductively-doped semiconductor material.

Like memory elements 102, 202, 302, and 402, memory elements 702 may comprise two-terminal memory elements made from a material capable of storing two or more memory states. Memory elements 702 may be formed in a memory layer disposed between WLs 710 and VBLs 709 such that a memory element 702 is positioned at and between each intersection (e.g., a crosspoint) of a WL 710 with its associated VBL 709 on each layer of memory device 700. Memory elements 702 may be in any of a variety of configurations including the vertical crosspoint RRAM shown in FIG. 7. Memory elements 702 may comprise a single homogenous composition, multiple discrete compositions, and the like.

BL 720 is coupled to VBLs 709 by selecting elements 704A and 704B through contact 706. Selecting element 704A comprises drain 708 coupled to source 711A, gate 712A, and body 714. Likewise selecting element 704B comprises drain 708 coupled to source 711B, gate 712B, and body 714. Selecting element 704A may be serially coupled to selecting element 704B. Drain 708 may have a different (or asymmetric) doping level than sources 711A and 711B such that selecting elements 704A and 704B are capable of providing a low impedance path for a first operation type, e.g., RESET, and high impedance for a second operation, e.g., SET or FORM. For example, drain 708 may have a higher doping level of $5E20/cm^3$ while sources 711A and 711B may have a doping level of $3E19/cm^3$.

A junction between sources 711A and 711B and contacts 707A and 707B, respectively, may form diodes 716A and 716B, which provides impedance that changes depending on the voltage applied across it. In an embodiment, diodes 716A and 716B will be Schottky-type diodes that will allow high currents with a low turn on voltage for positive polarity voltages and low currents with high impedance for negative polarity voltages.

Diodes 716A and 716B may be a single crystal silicon, polysilicon, or amorphous silicon Schottky diode. At least some embodiments of diodes 716A and 716B may require additional layers not shown in the figures but well-known to a person of ordinary skill in the art.

FIGS. 8A and 8B are diagrams of an embodiment of a method of achieving asymmetric source/drains according to the present disclosure. Referring to FIGS. 8A and 8B, an active region (not shown) is formed on a P-type body 814. Gate 812 is formed over the active region by first forming a gate oxide layer over the active region followed by a deposit of a conducting layer that is patterned and etched. Gate 812 may comprise polysilicon. Ion implantation 824 is then applied to implant N-type impurities into body 814 to form N-type source 808 and drain 810. A large angle ion implantation 826 may create N-type heavily doped source 808. A barrier layer (not shown) formed over drain 810 may prevent unintended doping of drain 810 during the large angle ion implantation 826. A person of ordinary skill in the art will recognize that many different ion types may be used, e.g., boron, arsenic, and the like, as well as implanting energies and dosage that vary with the specific design requirements. For example, a first doping level N+ is implanted in source 808 and drain 810. To achieve asymmetry, a second doping level N++ is implanted only in drain 810 to result in drain 810 having a higher doping level of $5E20/cm^3$ while source 808 may have a doping level of $3E19/cm^3$.

The process shown and described above may be similarly applied to an N-type substrate to fabricate a P-type asymmetric lightly-doped drain transistor device.

A person of ordinary skill in the art will recognize that they may make many changes to the details of the above-described memory device without departing from the underlying principles. Only the following claims, however, define the scope of the memory device.

The invention claimed is:

1. A memory device, comprising:
   a local bit line electrically coupled to a plurality of resistive memory cells; and
   a global bit line electrically coupled to the local bit line through first and second selectable parallel paths having first and second impedances, respectively;
   wherein the first path is active and the second path is in an off state in at least one of a set operation or a forming operation; and
   wherein the second path is active in a reset operation, wherein the second impedance of the second path has a lower impedance than the first impedance of the first path.

2. The memory device of claim 1,
   wherein the first path comprises a first switching element serially coupled to a first resistor; and
   wherein the second path comprises a second switching element.

3. The memory device of claim 1,
   wherein the first path comprises a first type of switching element; and
   wherein the second path comprises a second type of switching element different from the first type of switching element.

4. The memory device of claim 3,
   wherein the first type of switching element comprises a first source and drain doping level; and
   wherein the second type of switching element comprises a second source and drain doping level different from the first source and drain doping level.

5. The memory device of claim 1,
   wherein the global bit line electrically couples to the local bit line through a multiple gate switching element.

6. The memory device of claim 5,
   wherein the multiple gate switching element comprises a finFET device.

7. The memory device of claim 1, wherein the reset operation sets an impedance of a memory cell of the plurality of memory cells to a higher impedance than the set operation or the forming operation.

8. A memory device, comprising:
   a global bit line;
   a local bit line coupled to a plurality of resistive memory cells; and
   a coupling circuit configured to couple the global bit line to the local bit line through first and second selectable parallel impedance paths, such that a first coupling impedance is selectable for at least one of a set operation, a reset operation, or a forming operation, and a second coupling impedance is selectable for at least a different one other of the set operation, the reset operation, or the forming operation,
   wherein the second selectable impedance path has a second impedance lower than a first impedance of the first selectable impedance path.

9. The memory device of claim 8,
   wherein the coupling circuit is configured to couple the global bit line to the local bit line through the first selectable impedance path based on a set operation.

10. The memory device of claim 8,
    wherein the coupling circuit is configured to couple the global bit line to the local bit line through the second selectable impedance path based on a reset operation.

11. The memory device of claim 8,
    wherein the first selectable impedance path comprises a first type of switching element; and
    wherein the second selectable impedance path comprises a second type of switching element different from the first type of switching element.

12. The memory device of claim 11,
    wherein the first type of switching element comprises a first source and drain doping level; and
    wherein the second type of switching element comprises a second source and drain doping level.

13. The memory device of claim 12,
    wherein the first source and drain doping level is lower than the second source and drain doping level by at least a factor of ten.

14. A non-volatile memory device, comprising:
    a resistive memory element; and
    a selecting element having a first impedance path electrically coupled to the resistive memory element in response to a first control signal and having a second impedance path parallel to the first impedance path coupled to the resistive memory element only in response to a second control signal, wherein the second impedance path has a second impedance lower than a first impedance of the first impedance path.

15. The non-volatile memory device of claim 14,
wherein the first control signal is configured to indicate a reset operation; and wherein the second control signal is configured to indicate at least one of a set operation and a form operation.

16. The non-volatile memory device of claim 14,
wherein the selecting element comprises a source having a first doping level and a drain having a second doping level lower than the first doping level.

17. The non-volatile memory device of claim 16,
wherein the source of the selecting element is electrically coupled in series with the resistive memory element to form a junction.

18. The non-volatile memory device of claim 17, wherein the junction comprises a Schottky junction.

19. The non-volatile memory device of claim 18,
wherein the Schottky junction comprises a first impedance in response to a reverse bias and comprises a second impedance in response to a forward bias.

* * * * *